(12) United States Patent
Keysar et al.

(10) Patent No.: US 8,952,473 B2
(45) Date of Patent: Feb. 10, 2015

(54) INTEGRATED CIRCUIT COMBINATION OF A TARGET INTEGRATED CIRCUIT AND A PLURALITY OF CELLS CONNECTED THERETO USING THE TOP CONDUCTIVE LAYER

(75) Inventors: Shani Keysar, Haifa (IL); Reuven Holzer, Herzlia (IL); Ofer Navon, Pardes Hanna (IL); Rami Friedlander, Zichron Yaakov (IL)

(73) Assignee: Sol Chip Ltd., Haifa (IL)

(*) Notice: Subject to any disclaimer, the term of this patent is extended or adjusted under 35 U.S.C. 154(b) by 86 days.

(21) Appl. No.: 13/270,869

(22) Filed: Oct. 11, 2011

(65) Prior Publication Data

US 2012/0025342 A1 Feb. 2, 2012

Related U.S. Application Data

(63) Continuation-in-part of application No. 13/053,610, filed on Mar. 22, 2011, which is a continuation of application No. PCT/IL2009/000930, filed on Sep. 29, 2009.

(60) Provisional application No. 61/391,905, filed on Oct. 11, 2010, provisional application No. 61/100,770, filed on Sep. 29, 2008.

(51) Int. Cl.
*H01L 27/14* (2006.01)
*H01L 25/16* (2006.01)
*H01L 31/0392* (2006.01)

(52) U.S. Cl.
CPC ........ *H01L 25/167* (2013.01); *H01L 31/03921* (2013.01); *Y02E 10/50* (2013.01)
USPC ........................................ 257/431; 257/446

(58) Field of Classification Search
CPC ............ H01L 31/02021; H01L 31/042; H01L 31/0522; H01L 27/142; H01L 31/0232; H01L 31/048; H01L 31/0521; H01L 31/058; H01L 31/0524
USPC .............. 257/446, 431; 438/19; 136/252, 244
See application file for complete search history.

(56) References Cited

U.S. PATENT DOCUMENTS 4,784,701 A 11/1988 Sakai et al.
5,155,565 A 10/1992 Wenz et al.
(Continued)

FOREIGN PATENT DOCUMENTS

| JP | 09312349 | * 2/1997 |
|---|---|---|
| JP | 9312349 | 12/1997 |
| WO | WO 03/079438 | 9/2003 |

OTHER PUBLICATIONS

International Search Authority: International Search Report for the corresponding International Patent Application PCT/IL2009/000930; Date of Completion: Feb. 10, 2010.
(Continued)

*Primary Examiner* — Duy T Nguyen
(74) *Attorney, Agent, or Firm* — M&B IP Analysts, LLC

(57) ABSTRACT

A target integrated circuit (TIC) having a top conductive layer (TCL) that may be connected to a plurality of cells that are further integrated over the TIC. Each of the plurality of cells comprises two conductive layers, a lower conductive layer (LCL) below the cell and an upper conductive layer (UCL) above the cell. Both conductive layers may connect to the TCL of the TIC to form a super IC structure combined of the TIC and the plurality of cells connected thereto. Accordingly, conductivity between the TIC as well as auxiliary circuitry to the TIC maybe achieved.

6 Claims, 8 Drawing Sheets

(56) References Cited

U.S. PATENT DOCUMENTS

| | | | |
|---|---|---|---|
| 5,527,716 A | 6/1996 | Kusian et al. | |
| 5,998,808 A | 12/1999 | Matsushita et al. | |
| 6,680,468 B1 | 1/2004 | Wang | |
| 7,098,394 B2 | 8/2006 | Armer et al. | |
| 7,196,391 B2 | 3/2007 | Hsieh | |
| 7,675,158 B2 | 3/2010 | Kim et al. | |
| 2002/0170591 A1 | 11/2002 | Armer et al. | |
| 2007/0079866 A1* | 4/2007 | Borden et al. | 136/252 |
| 2007/0087230 A1 | 4/2007 | Jenson et al. | |
| 2009/0288700 A1* | 11/2009 | Lifka et al. | 136/251 |
| 2010/0018565 A1* | 1/2010 | Funakoshi | 136/244 |
| 2010/0148293 A1* | 6/2010 | Jain et al. | 257/434 |
| 2010/0186804 A1* | 7/2010 | Cornfeld | 136/255 |

OTHER PUBLICATIONS

International Search Authority: International Preliminary Report on Patentability (Chapter I of the Patent Cooperation Treaty) including "Written Opinion of the International Searching Authority" (PCT Rule 43bis. 1) for the corresponding International Patent Application No. PCT/IL2009/000930; Date of Issuance: Mar. 29, 2011.

* cited by examiner

INTEGRATED CIRCUIT COMBINATION OF A TARGET INTEGRATED CIRCUIT AND A PLURALITY OF CELLS CONNECTED THERETO USING THE TOP CONDUCTIVE LAYER

This application claims the benefit of U.S. provisional patent application 61/391,905 filed on Oct. 11, 2010, and is a continuation-in-part of U.S. patent application Ser. No. 13/053,610 filed on Mar. 22, 2011, which is a continuation of PCT application No. PCT/IL/2009/000930, entitled "Integrated Solar Powered Device" filed Sep. 29, 2009, which claims priority from U.S. provisional patent application No. 61/100,770, filed Sep. 29, 2008. All the above-referenced applications are assigned to common assignee and hereby incorporated by reference for all that they contain.

TECHNICAL FIELD

The invention generally relates to integrated circuit chips, and more particularly to adding a plurality of cell structures over a target integrated circuit (IC).

BACKGROUND OF THE INVENTION

Integration circuits (ICs) or chips designed using, for example, a very-large-scale integration (VLSI) process typically draw power from external sources such as grid power (mains), batteries or the like. Increasingly, however, devices utilizing such components demand greater levels of energy efficiency. This is largely due to the prevalence of wireless and mobile devices with convenience items becoming more widespread.

Personal communication devices, such as mobile phones, PDAs, handheld PCs, and the like, as well as many entertainment devices, such as media players, MP3, MP4, mobile DVD, digital cameras, and the like, as well as other household, office and leisure gadgets are commonly powered by batteries of electrochemical power cells. A drawback with battery-operated devices is that electrochemical power cells often run out of power. Thus, batteries need to be regularly recharged or replaced.

Such devices may be less dependent upon power provided by electrochemical power cells if some of their components were able to power themselves. Thus, the energy efficiency of mobile devices may be improved by a convenient and effective solar powered VLSI chip.

Furthermore, such solar powered components could be effectively used in applications where a power supply is unavailable. Self-powering components may therefore be utilized in a variety of stand-alone communication units, road signs for remote locations, in buoys, floats, or other maritime applications.

Although attempts have been made to connect VLSI chips to elements, such as photovoltaic cells (PVs) in order that they might draw solar power therefrom, the chips and photovoltaic cells are generally manufactured separately and later connected together using external wiring, gates, contacts or terminals.

For example, U.S. Pat. No. 6,680,468 to Wang, entitled, "Electrical-supply-free MOS integrated circuit", describes an electrical-supply-free MOS integrated circuit that includes a semiconductor device having a current terminal, an input voltage terminal, and a common terminal. The voltage difference between the input voltage terminal and the common terminal controls current flow through the current terminal. An opto-electronic device is also provided to convert incident light into an electrical signal. In another example, PCT Application Publication No. WO/2003/079438 to Jaussaud, et al. entitled, "Multijunction Photovoltaic Device with Shadow-free Independent Cells and the Production Method Thereof", describes a multijunction photovoltaic device with independent cells. Contact pick-ups are provided on the front and/or rear face of the cells by means of metal wells, the sides of which are insulated from the semi-conducting layers.

Furthermore, US Patent Application Publication No. 2002/0170591 to Armer, et al., entitled "Method and apparatus for powering circuitry with on-chip solar cells within a common substrate", describes a light-powered transponder. In order to create sufficient voltage differential, two photovoltaic elements are used. The photovoltaic elements generate voltages of different polarities. Despite the inherent difficulties presented by the use of a standard Complementary metal-oxide-semiconductor (CMOS) process, Aimer's system is directed towards achieving a voltage differential sufficient to power an ASIC by using photovoltaic elements independently to generate voltages with different polarities. As mentioned, all the above-described solutions require separate interconnecting conductors between their integrated circuits and their power sources. However, any additional components compromise the dimensions of the host devices and may provide additional sources of failure. The discussed-above publications are merely provided as a reference for their useful background descriptions of the state of the art heretofore.

FIG. 1 shows a schematic block diagram representing a solar powered integrated circuit 100. It is noted that, in order to use solar energy, devices are typically designed to include three separate components: an integrated circuit 104; a photovoltaic cell 102; and a connecting interface 103.

The integrated circuit 104 may be a miniaturized electronic circuit typically including semiconductor devices as well as passive components. ICs are generally manufactured upon the surface of a thin substrate of semiconductor material. Variously, integrated circuits 104 may be based upon complementary metal-oxide-semiconductor (CMOS) chips, micro-electro-mechanical systems (MEMS) chips, a very large scale integration (VLSI), or the like.

The photovoltaic cell 102 is configured to convert light into electricity typically using the photovoltaic effect. As the photovoltaic cell 102 is typically manufactured separately from the IC, it is necessary to provide the connecting interface 103.

The connecting interface 103 provides a conductive pathway, such as external wiring, gates, contacts, terminals, and the like, between the photovoltaic cell 102 and the integrated circuit 104. In addition, the connecting interface may further provide an intermediate external source layer of a power supply, such as an electrochemical cell, a capacitor or the like.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

SUMMARY OF THE INVENTION

Figure 1:
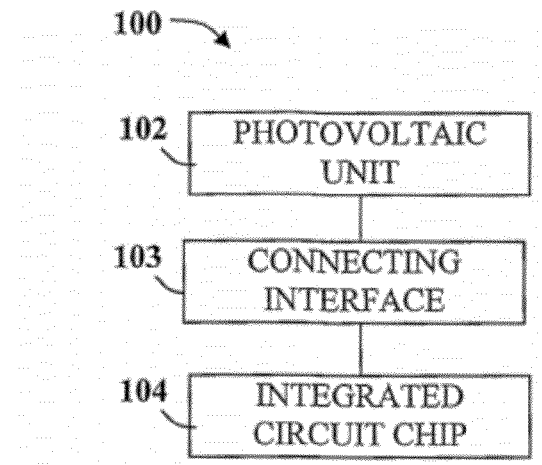
FIG. 1 is a schematic block diagram representing a solar powered integrated circuit.

Various embodiments disclosed herein include an integrated circuit. The integrated circuit comprises a target integrated circuit (TIC) containing at least an electrical circuit therein; and a plurality of cell structures formed over the TIC, wherein each of the plurality of cell structures comprising at least a lower conducting layer (LCL) and an upper conducting layer (UCL), wherein at least a first cell structure of the plurality of cell structures is coupled to a second cell structure of the plurality of cell structures between any one of their respective UCLs and LCLs.

Various embodiments disclosed herein also include a manufacturing method of an integrated circuit combined with a target integrated circuit (TIC). The method comprises manufacturing a target integrated circuit (TIC) containing at least an electrical circuit therein; forming a lower conductive layer (LCL) of at least one cell structure of a plurality of cell structures over the surface of the TIC; forming an upper conducting layer (UCL) of at least one cell structure of a plurality of cell structures to complete the at least one cell structure; and forming an electric coupling between at least a first cell structure of the plurality of cell structures and a second cell structure of the plurality of cell structures between any one of their respective UCLs and LCLs.

Various embodiments disclosed herein further include a manufacturing method of an integrated circuit combined with a target integrated circuit (TIC). The method comprises receiving a previously manufactured target integrated circuit (TIC) containing at least an electrical circuit therein; forming a lower conductive layer (LCL) of at least one cell structure of a plurality of cell structures over the surface of the TIC; forming an upper conducting layer (UCL) of at least a cell structure of a plurality of cell structures to complete the at least a cell structure of a plurality of cell structures; and forming an electric coupling between at least a first cell structure of the plurality of cell structures and a second cell structure of the plurality of cell structures between any one of their respective UCLs and LCLs.

DETAILED DESCRIPTION OF THE INVENTION

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Certain exemplary embodiments disclosed herein include a target integrated circuit (TIC) having a top conductive layer (TCL) that may be connected to a plurality of cells that are further integrated over the TIC. Each of the plurality of cells comprises two conductive layers, a lower conductive layer (LCL) below the cell and an upper conductive layer (UCL) above the cell. Both conductive layers may connect to the TCL of the TIC to form a super IC structure combined of the TIC and the plurality of cells connected thereto. Accordingly, conductivity between the TIC as well as auxiliary circuitry to the TIC maybe achieved.

Further embodiments disused herein below relate to cell structures that combine a TIC and a power cell comprising at least one PV cell and processing thereof are discussed herein below. The process of manufacturing the integrated circuit (IC) may be any micro-electro-mechanical systems (MEMS) process, standard complementary metal-oxide semiconductor (CMOS) processes, very large scale integration (VLSI), and the like.

Figure 2A:
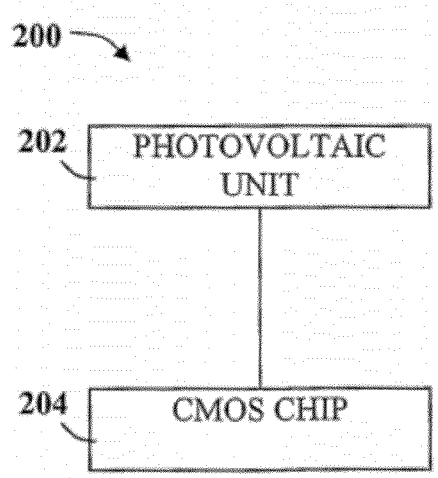
FIGS. 2A and 2B are schematic block diagrams representing two ASIC units according to exemplary embodiments of the integrated solar powered device.
Figure 2B:
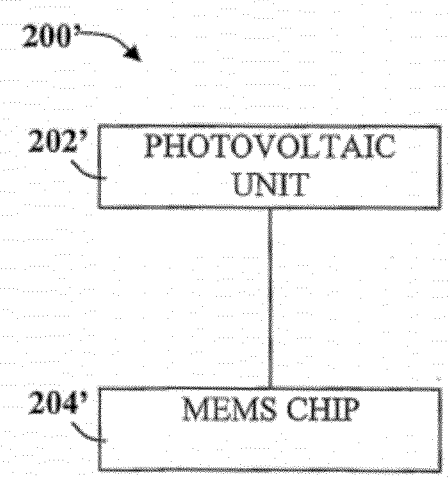

FIGS. 2A and 2B, schematically show block diagrams representing two embodiments of solar-powered application specific integrated circuit (ASIC) units. With particular reference to FIG. 2A, one embodiment of the solar powered ASIC 200 may include a photovoltaic cell 202 and a CMOS-type chip 204. In FIG. 2B, another embodiment of the solar powered ASIC 200' is shown including the photovoltaic cell 202' and a MEMS-type chip 204'. It should be appreciated by one skilled in the art that embodiments of the solar powered ASIC disclosed herein do not require connecting interfaces, such as the interfaces 103 shown in FIG. 1. It should be further appreciated that reducing the number of separate components is important in technologies, such as integrated circuits, where space saving is an important factor.

Self-powering ASIC units, such as embodiments of the solar powered ASICs 200 and 200' may be enabled by fabricating an integrated circuit upon p-type wafers, for example. P-type wafers are commonly used as substrate materials for both photovoltaic cells and semiconductor devices. Thus, a common p-type wafer substrate may be shared by the photovoltaic cell 202, 202' and the chip 204, 204', thereby reducing the total space requirements. According to some embodiments, a photovoltaic cell layer may be fabricated over a VLSI device, or alternatively a photovoltaic cell may be fabricated onto one side of the substrate with the VLSI fabricated upon the reverse side. Various photovoltaic fabrication techniques may be used, including thin-film manufacturing, and the like.

Thus, the photovoltaic cell 202, 202' and chip circuit 204, 204' may be manufactured in one process or as one piece with no additional connecting interface. Hence, the solar-powered ASIC may be manufactured in one process, according to electrical and other rules for integration of the layers.

Possible methods for the fabrication of embodiments of self-powering ASIC units are described below with reference to FIGS. 3 to 8. Specifically, FIGS. 3 to 7 show schematic cross sections representing the main elements of the ASIC unit during various stages of its fabrication. FIG. 8 is a flowchart showing the steps of a general method of manufacture.

Figure 3:
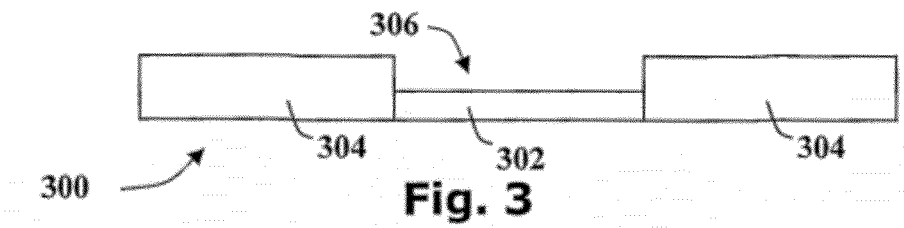
FIGS. 3 to 7 are schematic cross sections showing the stages of fabrication of an exemplary embodiment of the ASIC.

FIG. 3 is a schematic cross section showing the main elements of an integrated circuit base wafer 300. The base wafer 300 may be prepared, for example, using a standard CMOS process. In particular, the integrated circuit base wafer 300 includes metal pads 302 and a passivation layer 304.

The passivation layer 304 partially covers the metal pads 302. However, the passivation layer 304 is interrupted by openings 306 which provide channels through which an electrical connection may be formed between the metal pads 302 and overlying layers or other components.

Figure 4:
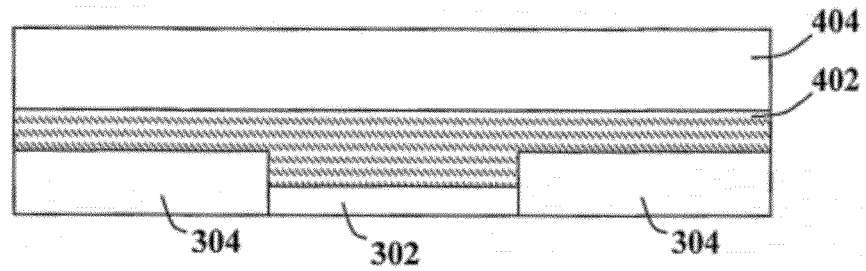

FIG. 4 is a schematic cross section showing the base wafer 300 of FIG. 3 over which photovoltaic enabling layers have been deposited. Two photovoltaic enabling layers are represented, a lower photovoltaic metal electrode layer 402 and a photovoltaic stack 404. Various materials, well known in the art, may be used as photovoltaic stacks 404 of embodiments of the solar powered ASIC. For example, thin film photovoltaic stacks may use hydrogenated amorphous silicon (a-Si.H), microcrystalline silicon (μ-Si:H) photo cells, cadmium telluride (CdTe), copper indium gallium selenide (CIGS) or the like.

The lower photovoltaic metal electrode layer 402 provides conductive communication between the photovoltaic stack 404 and the metal pads 302 exposed by openings in the passivation layer 304. Typically, the lower photovoltaic metal electrode layer 402 is a metal deposition layer such as aluminum for example, although any conducting layer may be used to suit requirements.

Figure 5:
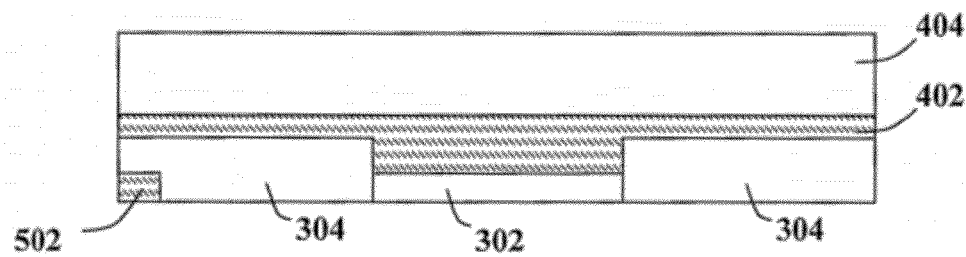

In FIG. 5, the cross section of the wafer of FIG. 4 is shown with an additional opening 502 exposing the metal pad 302 of the base wafer 300. The opening 502 may be used to provide a conductive channel connecting the metal pad 302 to the upper electrode 702 (FIG. 7) of the photovoltaic cell 404. Typically, the opening 502 may be created using an etching process in which the photovoltaic stack 404 is etched to re-expose the metal pads 302 and it is possible to expose new pads for connecting to the photovoltaic cell.

Figure 6:
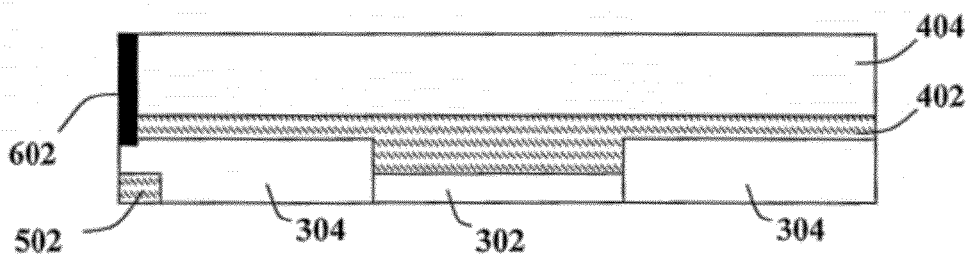

FIG. 6 shows a cross sectional view of the wafer of FIG. 5 including a separator 602. The separator 602 provides a film that isolates the top electrode 702 (FIG. 7) and bottom electrodes 402 of the photovoltaic stack 404. The separator 602 may be formed by deposition of an isolating film such as silicon dioxide ($SiO_2$), over the wafer, which may then be selectively etched back to re-expose. Typically, following the etching back process, spacers are located along the walls of the photovoltaic cell 404.

Figure 7:
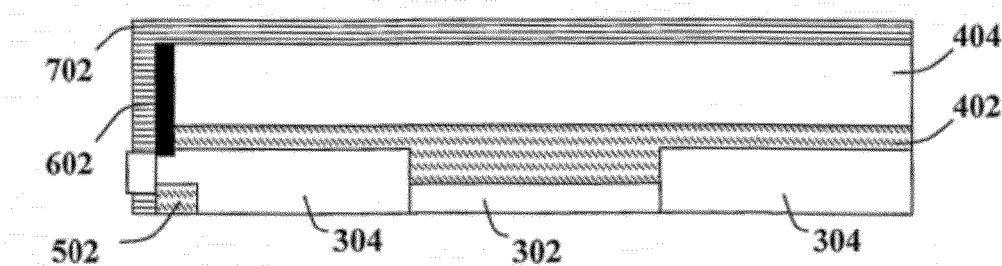
Figure 8:
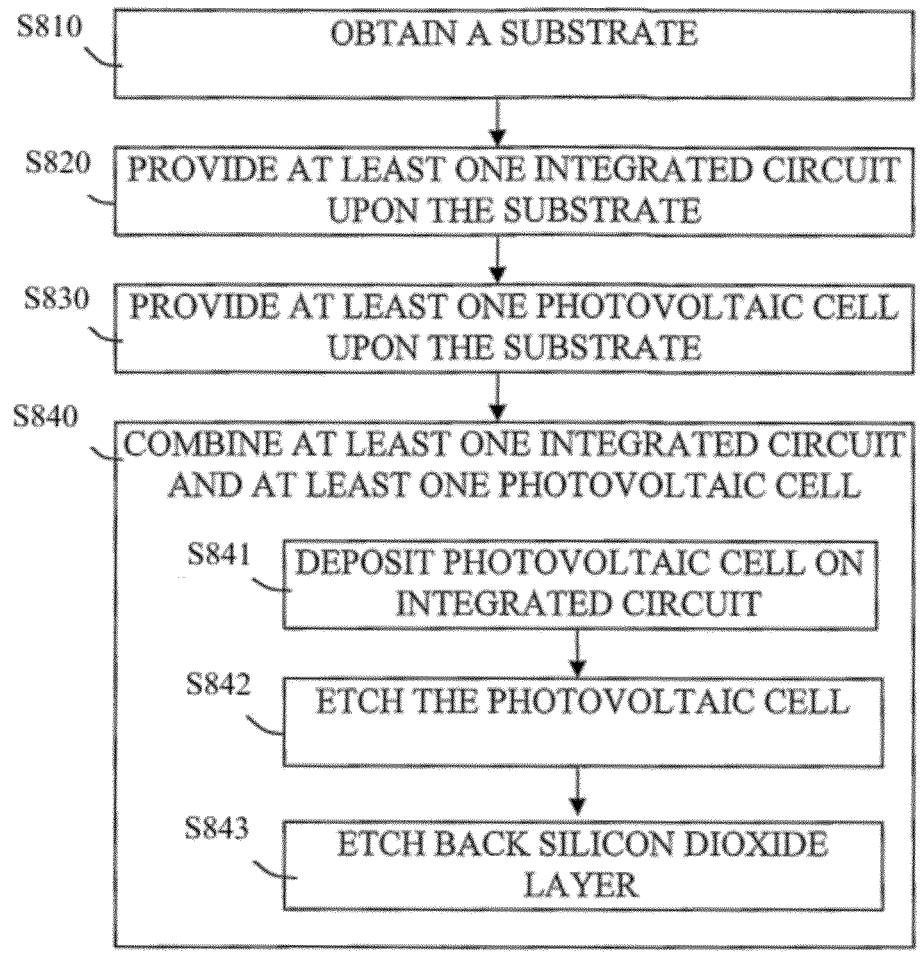
FIG. 8 is a flowchart illustrating a method for producing a self powering ASIC unit in accordance with an embodiment of the invention.

FIG. 7 shows a schematic cross section of the main elements of an embodiment of the solar powered ASIC following fabrication. A top electrode 702 has been provided for the photovoltaic stack 404. The top electrode 702 may be provided, for example, by depositing an aluminum layer over the photovoltaic stack 404 and in conductive communication with the base wafer via the opening 502 created during the etching process.

It is noted that the lower electrode 402 and the top electrode 702 may be prepared by the CMOS process that is used for the VLSI part of the integrated device, therefore may vary from one process to the other.

It should be appreciated that the embodiment described above in relation to FIGS. 3 to 7 relates to an integrated circuit having an overlaid photovoltaic cell. In alternative embodiments, the integrated circuit and photovoltaic layers may be deposited upon reverse sides of a single substrate. Other configurations should be apparent to one of ordinary skill.

FIG. 8 shows a non-limiting and exemplary flowchart representing a method for producing an essentially self-powering ASIC unit in accordance with an embodiment. The production method comprises obtaining a substrate (S810); providing at least one integrated circuit upon the substrate (S820); providing at least one photovoltaic cell upon the substrate (S830); and combining the at least one integrated circuit and at least one photovoltaic cell (S840).

In S810 a substrate is obtained. Integrated circuits may be manufactured in the surface of a thin substrate, optionally made of semiconductor material. In S820 at least one integrated circuit may be provided upon the substrate. The integrated circuit may be CMOS, MEMS or other circuits. In S830, at least one photovoltaic cell may be provided upon the substrate. A layer that comprises at least one photovoltaic cell may be added to the integrated circuit in order to produce the integrated ASIC.

In S840, the integrated circuit and the photovoltaic cell may be combined. In an embodiment of the invention, combining the integrated circuit and the photovoltaic cell into an integrated ASIC S840 may include depositing the at least one photovoltaic cell on the integrated circuit (S841); etching the at least one photovoltaic cell (S842); and etching back a silicon dioxide layer (S843).

In S841, the photovoltaic cell is deposited. On top of the integrated circuit, a Photovoltaic Metal Electrode (BPVE) layer is deposited and on top of BPVE layer a thin film photovoltaic stack is placed.

In S842 the photovoltaic cell etched. Strong acid or mordant is used to cut into the unprotected parts of a metal surface to create a design in the metal. The etching creates openings that re-expose parts of the integrated circuit and open new pads that are later to be connected to the top electrode of the photovoltaic cell.

In step S843 a silicon dioxide layer is being etched back. A silicon dioxide layer is deposited over the ASIC unit and then etched back, providing an isolating film between the top and bottom photovoltaic electrode.

Figure 9:
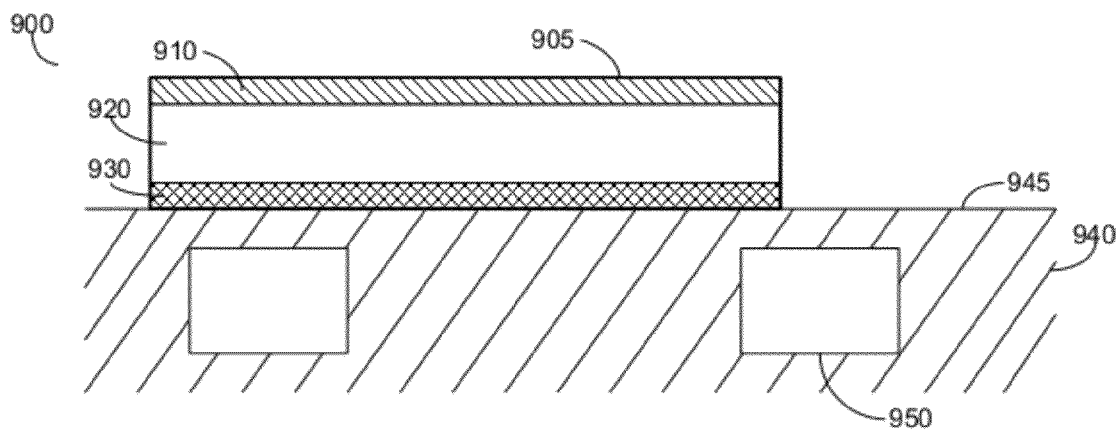
FIG. 9 is a schematic cross-section of a target integrated circuit (TIC) upon which a cell is integrated in accordance with an embodiment of the invention.

FIG. 9 shows an exemplary and non-limiting schematic cross-section 900 of a TIC 940 on which a cell 905 is integrated in accordance with an embodiment of the invention. The cell 905 is comprised of the cell device 920, for example, but without limitation, a photovoltaic (PV) cell as has also been discussed hereinabove, each such cell having a LCL 930 below the cell device 920 and further having a UCL 910 above the cell device 920. The cell 905 is integrated over the surface 945 of the TIC 940, which may be, without limitation, any kind of semiconductor devices that have a particular function. The TIC 940 further comprises a TCL 950 that is used to electrically connect the cell 905 to the electrical routing of the TIC 940, and as further described herein below.

Figure 10:
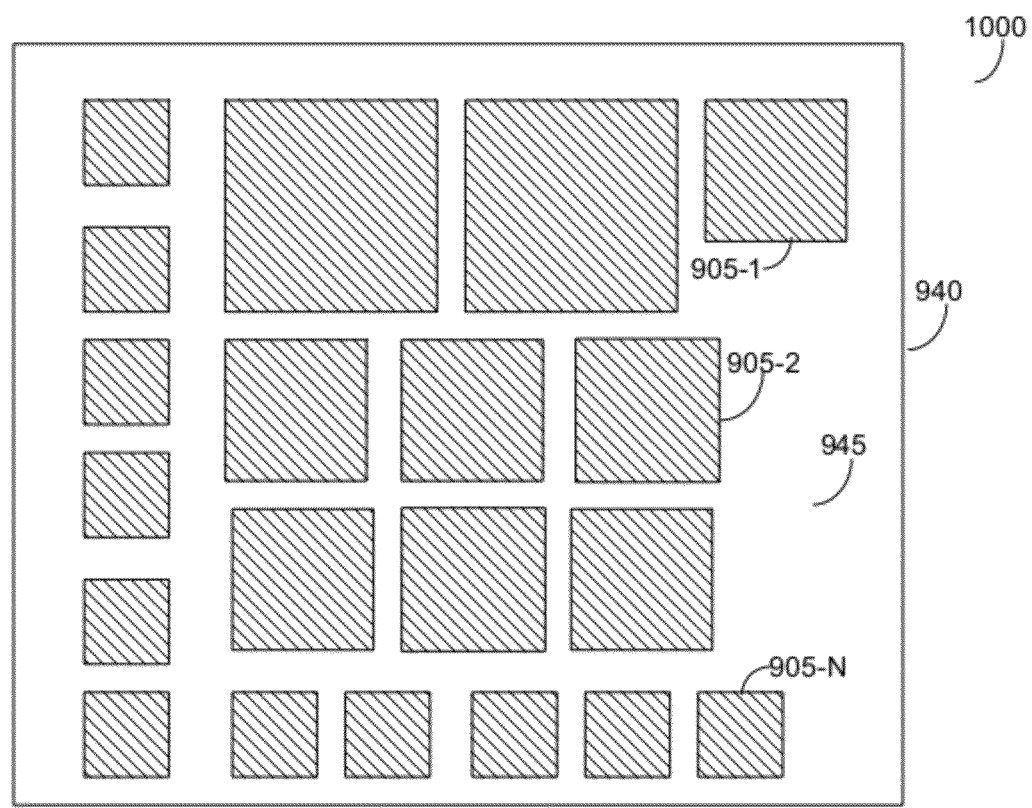
FIG. 10 is a top view of the target integrated circuit with a plurality of cells added on the top surface of the target integrated circuit.

FIG. 10 shows an exemplary and non-limiting top view of a TIC 940 with a plurality of cells 905 added on the top surface 945 of the TIC 940. According to the principles of the invention the plurality of cells 905-1 through 905-N may be the same kind of a cell. However, as also shown in FIG. 10, different cells 905 may be used, i.e., cell 905-1 may be different from cell 905-N. Accordingly different cells 905 may be used, each having different sizes and/or different shapes. The cells 905 may cover the entire TIC 940 or portions thereof, and all are mounted over the surface 945 of the TIC 940. Each of the cells 905 has an UCL and a LCL.

Figure 11:
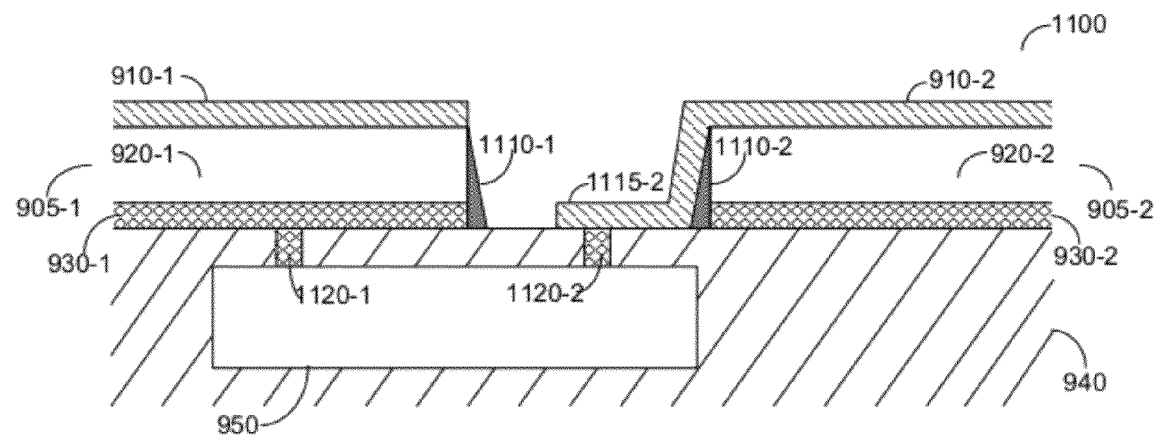
FIG. 11 is a schematic cross-section of two cells connected to the target integrated circuit according to an embodiment of the invention.

FIG. 11 shows an exemplary and non-limiting schematic cross-section 1100 of two cells 905 connected to the TIC 940 according to an embodiment of the invention. The two cells 905-1 and 905-2 are integrated over the TIC 940. The TIC 940 further comprises a TCL 950 to which through a connector 1120-1 an electrical connection is made between the TCL 950 to the LCL 930-1 of cell 905-1. In addition, a connector 1120-2 also connected to the TCL 950 through a conductive path 1115-2 which is further connected to UCL 910-2. Hence, an electrical connection is now formed from cell 905-1 through LCL 930-1, connector 920-1, TCL 950, connector 920-2, conductive path 1115-2 and UCL 910-2. An isolation spacer 1110-2 is used to ensure that the conducting path 1115-2 does not make unwanted connection to the cell device 920-2. The isolation spacer 1110-1 avoids unwanted connection to the LCL 930-1 of cell 905-1. The exemplary connection should not be understood as limiting upon the invention and other connection options are possible that are consistent with the spirit of the invention.

Figure 12:
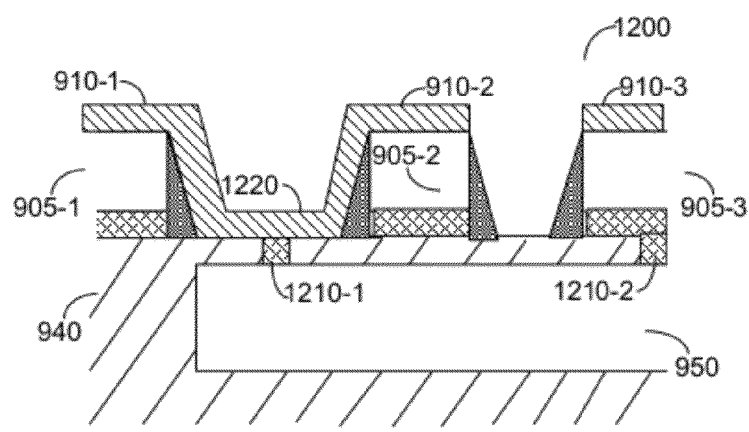
FIG. 12 is a schematic cross-section of three cells connected to the target integrated circuit according to an embodiment of the invention.

FIG. 12 shows an exemplary and non-limiting schematic cross-section 1200 of three cells 905-1, 905-2, and 905-3 connected to the target integrated circuit 940 according to the principles of the invention. From the UCL 910-1 and 910-2 a conducting path leads to a connector 1210-1 that connects both UCL 910-1 and 910-2 via the conductive path 1220 and the connector 1210-1 to the TCL 950 of TIC 940. The third cell 905-3 is connected to the TCL 950 of TIC 940 by means of connector 1210-2 that provides electrical connectivity to the LCL of cell 905-3. Thereby connectivity is achieved from the UCL of both cells 905-1 and 905-2 to the LCL of cell 905-3.

Figure 13:
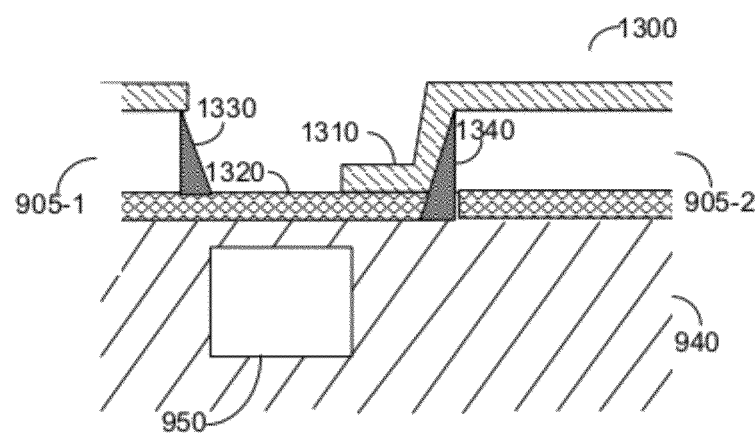
FIG. 13 is a schematic cross-section of two cells connected to each other from a lower conducting layer of a first cell to an upper conducting layer of a second cell.

The cross-section 1300 shown in FIG. 13 depicts two cells 905-1 and 905-2 connected to each other from the LCL of the first cell 905-1 to the UCL of the second cell 905-2. According to this embodiment, the LCL of the first cell 905-1 is extended beyond the cell 905-1 to form a conductive path 1320. The conductive path 1320 is connected to a conductive path 1310 that is further connected to the UCL of cell 905-2. According to this embodiment, a connection between the LCL of cell 905-1 and the UCL of cell 905-2 is achieved without a connection through the TCL 950 of the TIC 940. The isolation spacer 1330 is designed to allow the extension of the LCL of cell 905-1 to the conducting path 1310. The isolation spacer 1340 ensures that no conducting path is created between the conductive path 1310 and the LCL of cell 905-2.

Figure 14:
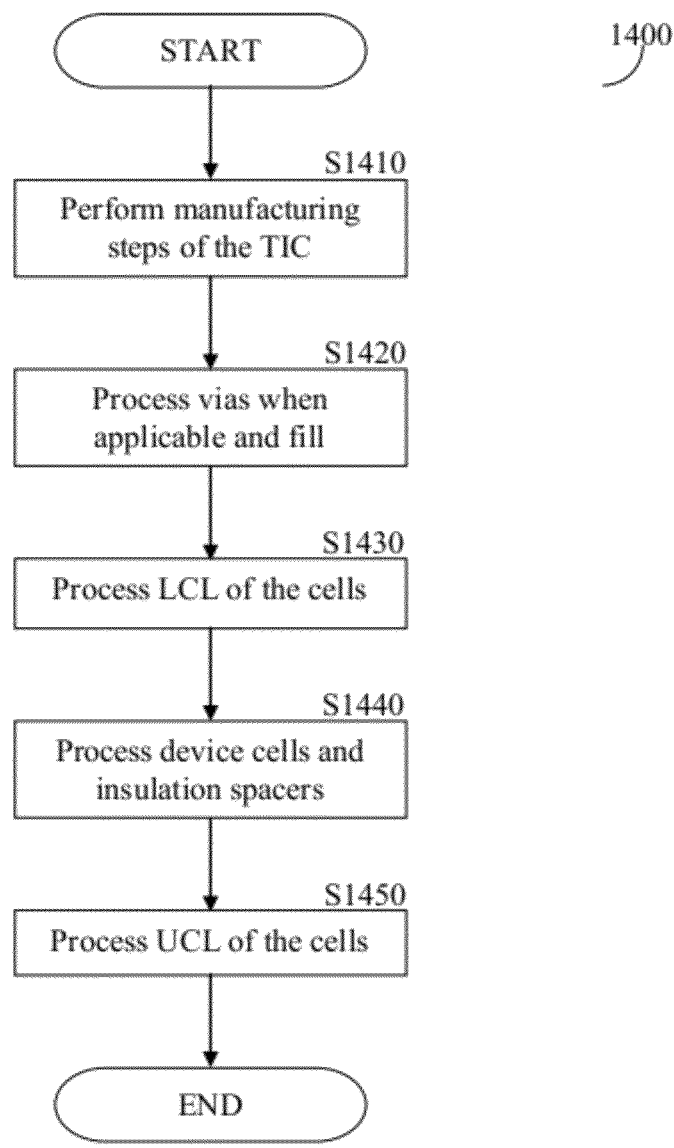
FIG. 14 is a flowchart describing manufacturing method of an integrated circuit combined with a target integrated circuit according to an embodiment the invention.

FIG. 14 shows a non-limiting and exemplary manufacturing method of an integrated circuit combined with a TIC in accordance with an exemplary and non-limiting embodiment of the invention. In S1410, a manufacturing process of the TIC is performed. This manufacturing process may be any fabrication technique known in the related. The manufactured TIC depends on the specific manufacturing process used, the type of conductive layers, and so on. In S1420, if applicable, vias are created in the TIC to allow for the connectors, such as connector 1120, to be formed by filling them with a conducting material such as an appropriate metal. In S1430, the LCL of the cells 905 is formed. In S1440, the cells and when applicable insulating spacers are formed as may be appropriate. In S1450 the UCL is manufactured to complete the manufacturing of the cells 905 and connections thereto.

The embodiments disclosed by the invention are only examples of the many possible advantageous uses and implementations of the innovative teachings presented herein. Particularly, it should be noted that while specific examples were provided with respect of PV cells the scope of the invention should not be viewed as limited to such PV cells. Other cells having the general structure discussed at least with respect of FIG. 9 are specifically included. Moreover, the invention is not restricted for use in CMOS, MEMS and Silicon technologies and may be equally implemented in other technologies such as, but not limited to, Gallium arsenide (GaAs), and silicon-germanium (SiGe) technologies. The devices may also include devices, such as junction gate field-effect transistor (JFET), metal semiconductor field effect transistor (MESFET), BiPolar, and others and any combinations thereof. In general, statements made in the specification of the present application do not necessarily limit any of the various claimed inventions.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing detailed description has set forth a few of the many forms that the invention can take. It is intended that the foregoing detailed description be understood as an illustration of selected forms that the invention can take and not as a limitation to the definition of the invention.

What is claimed is:

1. A self-powering integrated circuit comprising:
a thin film target integrated circuit (TIC) having at least an electrical circuit deposited upon a semiconductor substrate wherein the TIC further comprises a top conducting layer (TCL) formed within; and
a plurality of thin film cell structures deposited over the TIC, wherein each of the plurality of cell structures comprising at least a lower conducting layer (LCL) and an upper conducting layer (UCL), at least one of the plurality of thin film cell structures connected to the TIC for the self-powering the at least electric circuit of the TIC,
wherein at least a first cell structure of the plurality of cell structures is coupled to a second cell structure of the plurality of cell structures using a conducting path connecting at least a LCL of the at least first cell structure of the plurality of cell structures through a first connector to an upper surface of the TCL and from the upper surface of the TCL through a second connector to at least one UCL of the second cell structure of the plurality of cell structures.

2. The integrated circuit of claim 1, further comprises: an isolation spacer that provides electrical separation between the UCLs of the first and second cell structures.

3. The integrated circuit of claim 2, further comprises: another isolation spacer that provides electrical separation between the LCLs of the first and second cell structures.

4. The integrated circuit of claim 1, wherein a thin film cell structure of the plurality of thin film cell structures is a thin film photovoltaic cell.

5. The integrated circuit of claim 1, wherein the TIC is fabricated using at least one of: a metal-oxide-semiconductor (MOS) process, a complementary metal-oxide-semiconductor (CMOS) process, a junction gate field-effect transistor (JFET) process, a metal semiconductor field effect transistor (MESFET) process, a BiPolar technology, and a micro-electro-mechanical systems (MEMS) process.

6. The integrated circuit of claim 1, wherein the semiconductor substrate of the TIC is any one of: silicon, gallium arsenide (GaAs), and silicon-germanium (SiGe).

* * * * *